(12) United States Patent
Kwan et al.

(10) Patent No.: US 6,710,849 B2
(45) Date of Patent: Mar. 23, 2004

(54) METHOD FOR CALIBRATING A LITHOGRAPHIC PROJECTION APPARATUS AND APPARATUS CAPABLE OF APPLYING SUCH A METHOD

(75) Inventors: Yim Bun Patrick Kwan, Munich (DE); Leon Martin Levasier, Hedel (NL)

(73) Assignee: ASML Netherlands B.V., Veldhoven (NL)

( * ) Notice: Subject to any disclaimer, the term of this patent is extended or adjusted under 35 U.S.C. 154(b) by 93 days.

(21) Appl. No.: 09/944,145

(22) Filed: Sep. 4, 2001

(65) Prior Publication Data

US 2002/0026878 A1 Mar. 7, 2002

(30) Foreign Application Priority Data

Sep. 7, 2000 (EP) .............................................. 00203082

(51) Int. Cl.[7] .................... G03B 27/42; G03B 27/58; G03B 27/32; G01B 11/00
(52) U.S. Cl. .............................. 355/53; 355/72; 355/77; 356/401

(58) Field of Search .............................. 355/53, 67, 77, 355/55, 72; 356/399, 400, 401; 250/548, 492.2

(56) References Cited

U.S. PATENT DOCUMENTS 6,151,122 A * 11/2000 Taniguchi et al. .......... 356/399
6,341,007 B1 * 1/2002 Nishi et al. .................. 355/53

* cited by examiner

*Primary Examiner*—Peter B. Kim
(74) *Attorney, Agent, or Firm*—Pillsbury Winthrop LLP

(57) ABSTRACT

A method for calibrating a lithographic projection apparatus includes identifying a set of two or more reference positions of one a first and a second object table WTa, WTb or MT with a first detection system and simultaneously measuring those reference positions with a first position measuring system, identifying the same set of reference positions of said one object table with a second detection system and simultaneously measuring those reference positions with a second position measuring system, and correlating said first and said second position measuring systems using the measurements of the reference positions.

10 Claims, 2 Drawing Sheets

METHOD FOR CALIBRATING A LITHOGRAPHIC PROJECTION APPARATUS AND APPARATUS CAPABLE OF APPLYING SUCH A METHOD

BACKGROUND OF THE INVENTION

1. Field of the Invention

The present invention relates generally to lithographic projection apparatus and more particularly to a method for calibrating position measuring systems in a lithographic projection apparatus.

2. Background of the Related Art

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The first object table ensures that the mask can be held at a desired position in the incoming radiation beam, and that it can be moved relative to the beam if so desired.

A programmable mirror array held by a structure referred to as first object table. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference. A frame or first object table may support the programmable mirror array, which may be fixed or movable as required.

A programmable LCD array held by a structure referred to as first object table.

An example of such an array is given in U.S. Pat. No. 5,229,872, which is incorporated herein by reference. As above, the support structure in this case may be embodied as a frame or object table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

The lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference. The basic operating principle behind such multi-station apparatus is that, while a first substrate table is at a first station underneath the projection system so as to allow exposure of a first substrate located on that table, a second substrate table can run to a second station, discharge an exposed substrate, pick up a new substrate, perform some initial metrology steps on the new substrate, and then stand by to transfer this new substrate to the first station underneath the projection system as soon as exposure of the first substrate is completed, whence the cycle repeats itself; in this manner, it is possible to achieve a substantially increased machine throughput, which in turn improves the cost of ownership of the machine. It may be even more advantageously to use three or more stations, which perform different processing steps on the substrate to improve the throughput of the apparatus.

In the same way, it is possible to conceive a lithographic projection apparatus having more than one mask table. Such a machine could, for example, be useful in a scenario in which each layer of a die is exposed to images from multiple masks; in that case, the presence of multiple mask tables could significantly improve throughput. In the discussion which follows, the invention may generally be presented in the context of an apparatus having multiple substrate tables. However, it will be appreciated that the discussion is equivalently applicable to an apparatus having multiple mask tables.

In an exemplary multi-station apparatus a position control system will be used to control the position of the substrate table in the apparatus. This system may comprise a first position measuring system for measuring a position of the substrate table at a first station and a second position measuring system for measuring a position of the substrate table at a second station, and any number of further position measuring systems for measuring a position of the substrate table at a corresponding number of further stations. It is very important that these position measuring systems be correlated with a high accuracy because data measured at a particular position on the substrate during the initial metrology steps in the second station will be used at said particular position during exposure in the first station. One of the problems that may occur is that the scaling offset of the first position measuring system at the first station may be different with respect to the scaling offset of the second position measuring system at the second station due to environmental influences. The scaling offset is the ratio between the actual separation of two positions on the substrate table and the derived separation as measured by each position measuring system. In case the scaling offset differs between the first position measuring system and the second position measuring system it is impossible for the position control system to reproduce a position measured at one station at another station with the required accuracy. In a single-station apparatus a scaling offset will not occur because metrology steps and exposure are done at the same station with a single position measuring system.

SUMMARY OF THE INVENTION

One aspect of an embodiment of the present invention provides a method for calibrating at least two different position measuring systems that are used to measure a position of an object table in at least two different stations in a lithographic projection apparatus, with respect to each other.

In one embodiment of a method in accordance with the present invention, the calibration method includes:

identifying a set of two or more reference positions of one of said first and second object table with a first detection system and simultaneously measuring those reference positions with a first position measuring system;

identifying the same set of reference positions of said one object table with a second detection system and simultaneously measuring those reference positions with a second position measuring system; and correlating said first and said second position measuring systems using the measurements of the reference positions.

In the event that there are N object tables and respective stations, where N>2, then the identification step is performed N times, and the correlating step will involve N position measuring systems. By detecting a set of two or more reference positions of said object table and simultaneously measuring the position of said object table with a position measurement system it is possible to determine a scaling offset. By doing this for each of the position measuring systems it is possible to correlate measurements of the different position measuring systems to each other. Detection of a set of two or more reference positions can be accomplished by detecting a set of two or marks present on the plane of the object table with a detection system associated with the first measurement system and one associated with the second measurement system. Other offsets than the scaling offset may be caused by non-linear, higher-order errors in the measuring systems. These higher order errors may be calibrated by correlating the different position measuring systems by multi-degree polynomials using the measurements from multiple reference positions. During the calibration method the object table will be moved such that a sequence of marks on the object table will be detected by the detection systems, so as to identify their reference positions. For this purpose two or more marks can be provided on the object table, or a workpiece (i.e. substrate or mask as appropriate) with two or more marks can be provided to the object table. Each position measuring system measures a displacement (i.e. a reference distance) of the object table in at least the X and Y direction, respectively between detection of the first and the second of the two or more marks. One could also determine the two or more reference positions by detecting an aerial image of one mark projected upon the plane of the object table with two or more detectors provided to said plane. The distance between both detectors will give the reference distance in that case.

By knowing the reference distance in the X direction (Reference DX) between two marks or detectors, and therefore between the two reference positions, the following formula can be used to calculate a relative scaling offset:

Scaling offset($X$)=Measured $DX$/Reference $DX$

A similar offset can be calculated for the absolute scaling offset in the Y, Z direction and rotations around the X, Y and Z direction. It must be understood that the scaling offset thus calculated can be used to calculate a particular position as a function of a measured value in a particular station. By doing so for each stations, each position measuring system is calibrated. The scaling offset may show a certain drift, such that it may be necessary to calculate the scaling offset more than once, for example for every substrate processed by the apparatus.

One could also calibrate the position measuring systems of a first station (st.1) to that of a second station (st.2) by the following formula, to obtain a relative scaling offset:

Scaling offset($X$ st.1 to $X$ st.2)=Measured $DX(st.\,1)$/Measured $DX(st.2)$

An advantage of using a relative scaling offset is that any linear scaling effect, such as thermal expansion of the object table, which increases the distance between the two marks linearly can be taken into account in the correlation procedure. With more than two stations, you can select one station as "holy" and correlate all others to that one, or you can correlate any two stations to each other.

According to a further aspect of an embodiment of the present invention there is provided a lithographic projection apparatus including:
- a radiation system for supplying a projection beam of radiation;
- a first object table for supporting patterning structure, the patterning structure serving to pattern the projection beam according to a desired pattern;
- a second object table for holding a substrate; and
- a projection system for projecting the patterned beam onto a target portion of the substrate
- a first position measuring system for measuring the position of one of said first and second object table;
- a first detection system for identifying a reference position of said one object table within the range of said first position measuring system;
- a second position measuring system for measuring the position of said one object table; and,
- a second detection system for identifying a reference position of said one object table within the range of said second position measuring system; characterized in that said apparatus comprises calculating means connected to said first and said second position measuring system and said first and said second detection system for correlating to each other measurements of said first and said second position measuring system.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF THE DRAWINGS

The invention and its attendant advantages will be further elucidated with the aid of exemplary Embodiments and the accompanying schematic drawings, wherein.

DETAILED DESCRIPTION

EMBODIMENT 1

Figure 1:
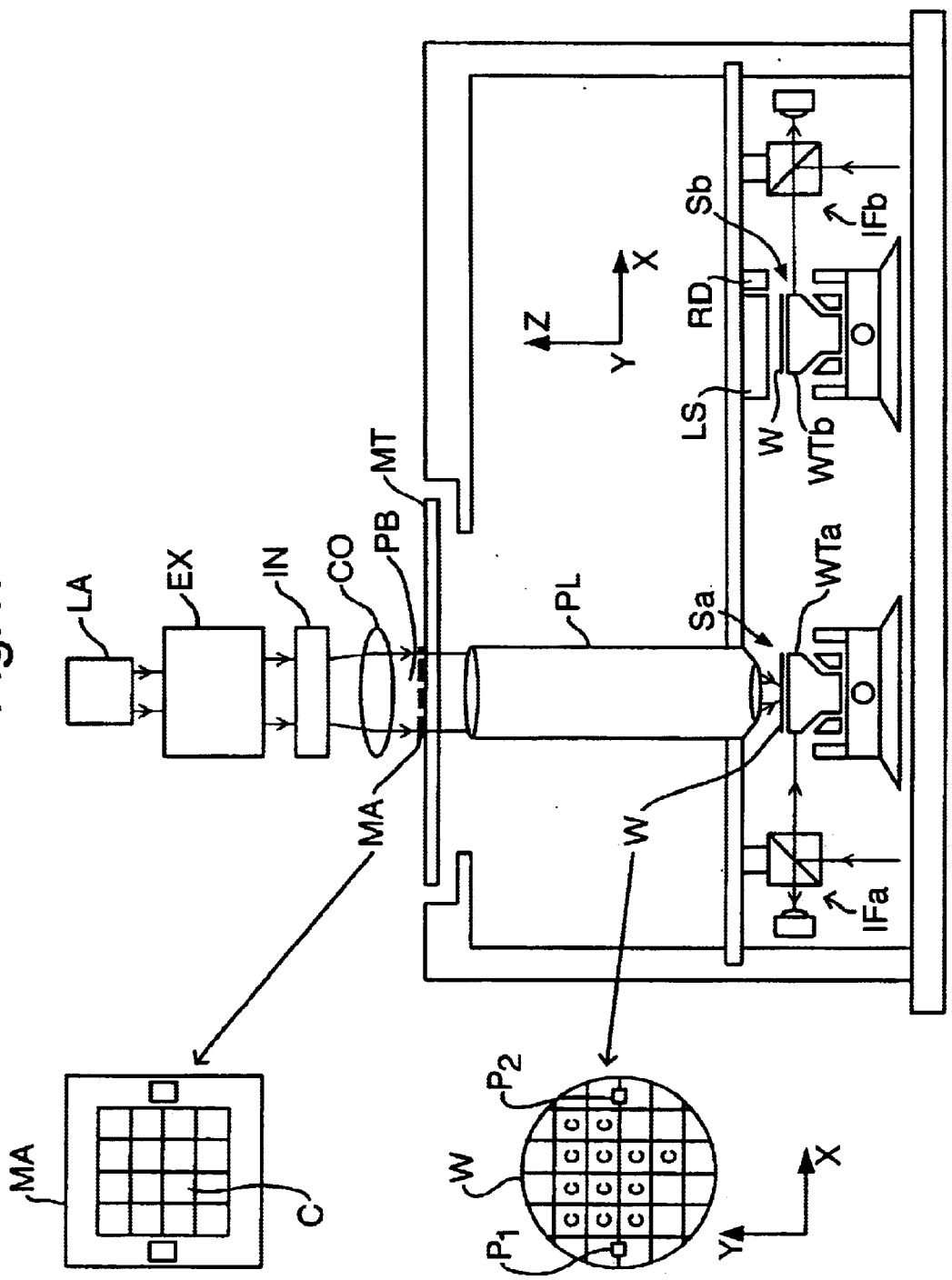
FIG. 1 schematically depicts a lithographic projection apparatus suitable for use with the method according to the invention.

FIG. 1 schematically depicts a lithographic projection apparatus suitable for use with the method according to a first embodiment of the invention. The apparatus comprises:
- a radiation system LA, Ex, IN, CO for supplying a projection beam PB of radiation (e.g. UV or EUV radiation, X-ray, ions or electrons);
- a mask table (first object table) MT provided with a mask holder for holding a mask MA (e.g. a reticle), and connected to first positioning means for accurately positioning the mask with respect to a reference such as item PL;
- a first substrate table (second object table) WTa provided with a substrate holder for holding a substrate W (e.g. a resist-coated silicon wafer), and connected to second positioning means for accurately positioning the substrate with respect to a reference such as item PL;
- a second substrate table WTb provided with a substrate holder for holding a substrate W, and connected to third positioning means for accurately positioning the substrate with respect to a reference such as item PL;
- a projection system ("lens") PL (e.g. a refractive or catadioptric system, a mirror group or an array of field deflectors) for imaging an irradiated portion of the mask MA onto a target portion C of a substrate W held on the first or second substrate table at a first, or exposure, station Sa;
- a levelling system LS for performing initial metrology steps on a substrate held on the first or second substrate table at a second, or metrology, station Sb; and
- a position control system provided with a first position measuring system IFa for measuring a position of one of the substrate tables at the first (exposure) station Sa and a second position measuring system IFb for measuring a position of the other one of the substrate tables at the second (metrology) station Sb.

As here depicted, the apparatus is of a transmissive type (i.e. has a transmissive mask). However, in general, it may also be of a reflective type, for example.

The radiation system comprises a source LA (e.g. a Hg lamp, excimer laser, an undulator provided around the path of an electron beam in a storage ring or synchrotron, a plasma source or an electron or ion beam source) which produces a beam of radiation. This beam is passed along various optical components comprised in the illumination system,—e.g. beam shaping optics Ex, an integrator IN and a condenser CO—so that the resultant beam PB has a desired shape and intensity distribution in its cross-section.

The beam PB subsequently intercepts the mask MA which is held in a mask holder on a mask table MT. Having traversed the mask MA, the beam PB passes through the lens PL, which focuses the beam PB onto a target portion C of the substrate W. With the aid of the interferometric displacement measuring means IFa and IFb, the substrate tables WTa, WTb can be moved accurately by the second and third positioning means, e.g. so as to position different target portions C in the path of the beam PB. Similarly, the first positioning means can be used to accurately position the mask MA with respect to the path of the beam PB, e.g. after mechanical retrieval of the mask MA from a mask library or during a mask scan. In general, movement of the tables MT, WTa, WTb will be realised with the aid of a long-stroke module (coarse positioning) and a short-stroke module (fine positioning), which are not explicitly depicted in FIG. 1. In the case of a wafer stepper (as opposed to a step-and-scan apparatus) the mask table MT may be connected only to a short stroke-positioning device, to make fine adjustments in mask orientation and position, or the mask table MT may be just fixed. The second and third positioning means may be constructed so as to be able to position the substrate tables WTa, WTb over a range encompassing both the first station Sa under projection system PL and the second station Sb under the levelling system LS. Suitable positioning systems are described, inter alia, in WO 98/28665 and WO 98/40791 mentioned above. It should be noted that a lithography apparatus may have multiple exposure stations and/or multiple metrology stations and that the numbers of metrology and exposure stations may be different than each other and the total number of stations need not equal the number of substrate tables. Indeed, the principle of separate exposure and metrology stations may be employed with one or more substrate tables.

The depicted apparatus can be used in two different modes:

1. In step-and-repeat (step) mode, the mask table MT is kept essentially stationary, and an entire mask image is projected at once (i.e. a single "flash") onto a target portion C. The relevant substrate table is then shifted in the X and/or Y directions so that a different target portion C can be irradiated by the beam PB;

2. In step-and-scan (scan) mode, essentially the same scenario applies, except that a given target portion C is not exposed in a single "flash". Instead, the mask table MT is movable in a given direction (the so-called "scan direction", e.g. the Y direction) with a speed v, so that the projection beam PB is caused to scan over a mask image; concurrently, the relevant substrate table WTa or WTb is moved in the same or opposite direction at a speed V=Mv, in which M is the magnification of the lens PL (typically, M=¼ or ⅕). In this manner, a relatively large exposure area C can be exposed, without having to compromise on resolution.

Figure 2:
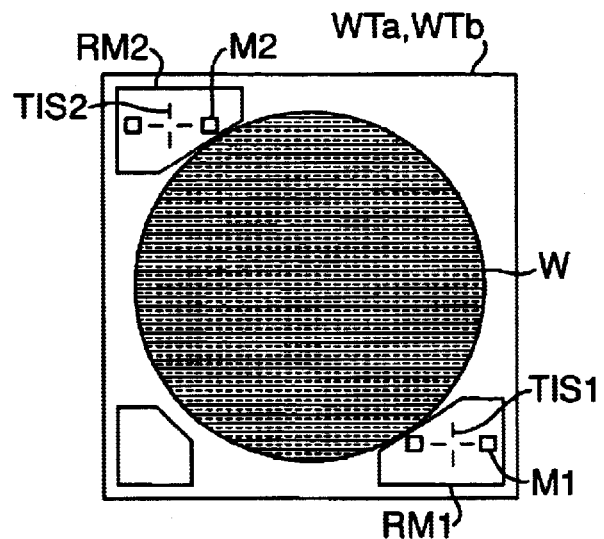
FIG. 2 schematically depicts an object table for use within the apparatus of FIG. 1.

When using the method according to the invention for calibrating a lithographic projection apparatus in a manufacturing process, the following steps may be used. Firstly, a substrate W is loaded on the substrate table WTb at the second station Sb. The substrate tables (see WTa, WTb in FIG. 2) have at the plane of the table two reference plates (e.g. fiducial plates) RM1 and RM2 provided with reference marks M1 and M2, respectively, and image sensors TIS1 and TIS2, respectively. The position of the marks M1 and M2 is detected under a mark detection system RD and at the same time the position of the relevant substrate table is measured with a position measuring system IFb in up to six degrees of freedom.

The measurement of the position of the substrate table may be done with a system as described in, for instance U.S. Pat. No. 6,020,964 (P-0077.010-US) or WO 99/32940 (P-0079.010-WO), which are incorporated herein by reference. In such a position measuring system, interferometer beams are directed to the relevant substrate table to measure its position. One could also use an optical encoder to read the position of the substrate table. In general an optical encoder comprises a readhead which reads the movements of a scale that may be mounted upon the substrate table. The position measuring system measures the translation of the substrate table when it is moved, such that the mark detection system RD firstly detects the first mark and subsequently the second mark, for example firstly M1 and then M2. By this procedure the position measuring system (IFa or IFb) measures the reference distance between the mark M1 and M2. Said distance is fixed for the substrate table and will give a good reference for scaling the position measurement system. If the substrate table is moved to another position measuring system the distance between the both marks may again be used for scaling said other position measuring system.

The mark detection system RD may be a system as described in WO 98/39689 (P-0070.010-WO) which is incorporated herein by reference, and may also be used to measure the position of marks located on the substrate W with respect to marks M1 and M2. Such a mark detection system uses an alignment beam of radiation that is directed to a reflective grating (a mark). The mark reflects the diffracted alignment beam to a detector, which measures the position of the mark.

At the second station Sb the levelling system LS may be used to measure the surface figure of a substrate W located on a substrate table as is described in more detail in European Patent Publication 1037117 (P-0128.010-EP), which is incorporated herein by reference. The levelling system LS may be used to measure a position in the Z direction and a rotation around the X and Y direction of a particular surface, for example.

Figure 3:
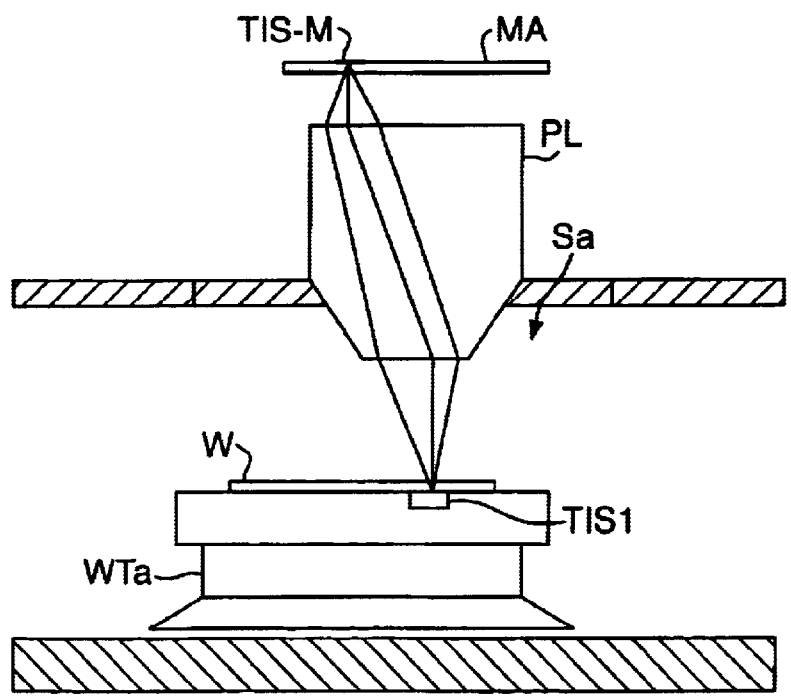
FIG. 3 schematically depicts a more detailed view of the first station of the apparatus of FIG. 1.

Once the substrate W is scanned with the levelling system LS and the position of marks M1 and M2 on the substrate table is determined, the substrate table may be moved to the first station Sa for exposure of the substrate W. Concurrently, the substrate table present at the first station should be moved from first station Sa to another location, for instance an unloading station. At the first station Sa, the image sensors TIS1 and TIS2 are used to determine the position of the substrate table with respect to an aerial image of a mark TIS-M on the mask M as is depicted in FIG. 3. Image sensors TIS1 and TIS2 comprise apertures in a surface located above a photo detector that is sensitive to radiation, for example, from the projection beam PB. By illuminating the mark TIS-M with the projection beam PB an aerial image of said mark will be projected upon the plane of the substrate table by the projection system. By scanning said aerial image over the apertures in the TIS1 sensor and by arranging the apertures such that they form a negative of the aerial image, the detector will give a maximal output indicating maximal irradiation when the detector is in the focal plane and in the center of the aerial image. An example of a transmissive image sensor suitable for use as detector TIS1 or TIS2 is described in greater detail in U.S. Pat. No. 4,540,277, and a reflective image sensor (as an alternative) is described in U.S. Pat. No. 5,144,363, which are incorporated herein by reference. TIS1 and M1 are comprised in the same reference plate RM1 and have a fixed calibrated distance between them; the same applies to TIS2 and M2 on RM2. By moving the substate table such that both image sensors (i.e. TIS1 and TIS2) subsequently detect the aerial image of the mark TIS-M, a reference distance is provided for the position measuring system IFa at the first station Sa.

One could also use a mark detection system as used at the second station Sb or a through-the-lens (TTL) alignment method as described in U.S. Pat. No. 5,481,362 (P-0032.010-US), which is incorporated herein by reference, to determine the scaling offset. Using the through-the-lens alignment method an alignment beam of radiation is directed through the projection system PL to a reflective grating located upon the substrate table. This grating will reflect the beam back into the projection system PL through a mark in the mask MA to a detector, which measures the radiation intensity of the image of the reflective grating, indicating the position of the reflective grating.

The scaling offset may be used in a calculating means to calculate a real position as a function of a measurement signal of the position measurement system (IFa or IFb) or may be used to link a measurement done with a first position measurement system to a measurement done with a second position measurement system. The scaling offset may be determined for every substrate manufactured with the apparatus. In this way the scaling offset will be adjusted for every substrate and the influence of drift will be minimized.

EMBODIMENT 2

The method according to a second embodiment of the invention may be used in the apparatus of FIG. 1. According to the second embodiment of the invention two position measurement systems (IFa and IFb) are calibrated to each other by using two marks (P1 and P2) located on the substrate W. After the substrate W is placed on the substrate table WTa or WTb two or more marks located on the substrate W are detected with a detection system in the second station Sb e.g. the detection system RD of FIG. 1. While moving from the first mark P1 to the second mark P2 the position of the substrate table (WTa or WTb) is measured with the position measuring system IFb. In this manner two reference positions are measured in the second station Sb and one can calculate a scaling offset for a particular position measuring system IFb by knowing the reference distance between the two marks (P1 and P2). By repeating this for the position measuring system IFa in the first station Sa one can relate both position measuring systems to each other. In the first station Sa a mark detection similar to the mark detection system RD, used in the second station Sb can be used or a through-the-lens (TTL) alignment system as described above may be used to detect the marks on the substrate.

While we have described above specific embodiments of the invention it will be appreciated that the invention may be practised otherwise than as described. The method may, for example, be used to calibrate the position measuring systems for measuring a position of an object table in more than two stations.

What is claimed is:

1. A method for calibrating a lithographic projection apparatus comprising:
    identifying a set of two or more reference positions of an object table with a first detection system and measuring the reference positions with a first position measuring system;
    identifying the same set of reference positions of said object table with a second detection system and measuring those reference positions with a second position measuring system; and
    calculating a corrected set of measurements for said first and said second position measuring systems using the measurements of the reference positions.

2. A method according to claim 1, wherein said set of reference positions are identified by detecting at least two marks provided to said object table.

3. A method according to claim 1, wherein said set of reference positions are identified by detecting at least two marks on a workpiece held by said object table.

4. A method according to claim 2, wherein said mark is a diffractive mark whose position is detected by directing a detection beam of radiation to said diffractive mark and measuring the intensity of sub-beams diffracted from said mark with an intensity detector such that the intensity detected by the intensity detector comprises an indication of the position of the mark with respect to that detector.

5. A method according to claim 1, wherein said set of reference positions are identified by detecting an aerial image of a mark by at least two image sensors provided to said object table and adapted to detect an aerial image of a mark.

6. A method according to claim 5, wherein said aerial image generated with a mark with a particular pattern is scanned over an image sensor comprising a similar pattern located on top of a light intensity detector such that the intensity detected by the intensity detector comprises an indication of the position of the aerial image with respect to said image sensor.

7. A method according to claim 1, wherein at least one of said first position measuring system and said second position measuring system comprises an interferometer system.

8. A method according to claim 1, wherein said calibration method is applied for every substrate processed in the lithographic projection apparatus.

9. A method according to claim 1, wherein said lithographic projection apparatus includes a radiation system comprising a radiation source.

10. A lithographic projection apparatus comprising:
    an illumination system to supply a projection beam of radiation;
    a first object table to support patterning structure, the patterning structure constructed and arranged to pattern the projection beam according to a desired pattern;
    a second object table to hold a substrate; and
    a projection system to project the patterned beam onto a target portion of the substrate;
    a first position measuring system to measure a position of one of said first and second object table;
    a first detection system to identity a reference position of said one object table within a range of said first position measuring system;
    a second position measuring system to measure a position of said one object table;
    a second detection system to identity a reference position of said one object table within the range of said second position measuring system; and
    a processor in communication with said first and said second position measuring system and said first and said second detection system, the processor being configured and arranged to calculate corrected measurements for said first and said second position measuring system.

* * * * *